United States Patent [19]

Murray et al.

[11] Patent Number: 4,663,770
[45] Date of Patent: May 5, 1987

[54] NON-VOLATILE COUNTING CIRCUIT AND METHOD WHICH PROVIDES FOR EXTENDED COUNTER LIFE

[75] Inventors: Kenelm G. D. Murray, Chiddingfold; Philip Woodhead, Woking, both of England

[73] Assignee: Hughes Microelectronics Limited, Glenrothes, Scotland

[21] Appl. No.: 832,113

[22] Filed: Feb. 24, 1986

[30] Foreign Application Priority Data

Feb. 27, 1985 [GB] United Kingdom ............... 8505080

[51] Int. Cl.⁴ .......................................... H03K 21/40
[52] U.S. Cl. ...................................... 377/28; 377/39; 377/44; 377/24; 377/15; 364/900; 371/4
[58] Field of Search ................... 377/37, 39, 44, 24, 377/28, 15; 364/148, 715; 371/15, 4

[56] References Cited

U.S. PATENT DOCUMENTS

| | | | |
|---|---|---|---|
| 3,526,758 | 9/1970 | Nozawa | 377/28 |
| 4,214,152 | 7/1980 | Hess | 377/28 |
| 4,319,355 | 3/1982 | Mollier | 371/4 |
| 4,453,210 | 6/1984 | Suzuki et al. | 371/4 |
| 4,559,637 | 12/1985 | Weber | 377/24 |

Primary Examiner—John S. Heyman
Attorney, Agent, or Firm—K. W. Float; A. W. Karambelas

[57] ABSTRACT

Counter circuit apparatus which sequentially re-allocates lower-order counting operation in order to extend counter life. The counter is comprised of a plurality of lower order counters and at least one higher order counter. A count selection circuit is coupled to the plurality of counters which controls the counting thereof in response to applied event input signals. A map control circuit is coupled between the higher order counter and the count selection circuit which controls the count selection circuit in response to signals derived from the higher order counter. The map control circuit sequentially enables a predetermined one of the lower order counters to count individual ones of the applied event input signals. A count unscrambling circuit is coupled to the plurality of lower order counters and the map control circuit which produces an ordered count output signal that is indicative of the number of event input signals counted by the counter. The operating lifetime of the counters is increased utilizing the principles of the present invention. One application of the present invention is that of a non-volatile up counter suitable for an odometer application. A counting method which provides for extended counter life is also disclosed.

9 Claims, 9 Drawing Figures

NON-VOLATILE COUNTING CIRCUIT AND METHOD WHICH PROVIDES FOR EXTENDED COUNTER LIFE

BACKGROUND OF THE INVENTION

The present invention relates generally to digital counter circuits, and more particularly, to digital counter circuits which re-allocate counting operations in lower-order counters as a function of the number of events counted in order to improve counter life. The present invention also relates to counting methods for use with non-volatile counters which improve counter life.

In many conventional non-volatile counter applications, such as in digital odometer applications, and the like, the lower order counters are required to endure a great deal of stress. This stress is due to the fact that they must perform a non-volatile WRITE action on each count. This WRITE action requires that the counter change state during each WRITE cycle. Accordingly, this WRITE action stresses the counter bits that have changed state since the previous WRITE action. The bits that have not changed state since the previous WRITE action endure a non-stressful non-volatile WRITE action which reinforces the data.

Therefore, lower order bits receive the burden of the stress, since they must change state more often than higher order bits. In an odometer application, for example, this is easy to see. In an odometer, the units decade is stressed each count, while the tens decade is stressed each 10 counts, and so forth for all decades of the counter. Accordingly, counter wear-out results from the multiple non-volatile writing of opposite data in any one bit of the counter.

SUMMARY OF THE INVENTION

In order to overcome the endurance limitations of prior art counting devices, and the like, the present invention provides for a non-volatile counter circuit which sequentially re-allocates lower-order counting operation in order to extend counter life. The counter is adapted to count applied event input signals. The counter circuit is comprised of a plurality of lower order counters and at least one higher order counter. A count selection circuit is coupled to the plurality of counters which controls the counting thereof in response to the event input signals.

A map control circuit is coupled between the higher order counter and the count selection circuit which controls the count selection circuit in response to signals derived from the higher order counter. The map control circuit sequentially enables a predetermined one of the lower order counters to count individual ones of the applied event input signals. A count unscramble circuit is coupled to the plurality of counters by way of a multiplexed data bus and to the map control circuit. The count unscramble circuit responds to output signals derived from the plurality of counters and count unscramble circuit and produces an ordered count output signal that is indicative of the number of event input signals counted by the counter circuit.

The operating lifetime of counter circuits in accordance with the principles of the present invention is increased due to an increase in the operating lifetime of the counter circuits used therein. This is accomplished by means of the map control circuit in conjunction with the count selection circuit which sequentially enables different ones of the lower order counters to count applied event input signals during predetermined time periods of the counter circuit operating lifetime.

For example, and not by way of limitation, the present invention may be employed as an odometer, or other similar up counter, or the like. In this application, the lower order counters may be the units, tens, hundreds and thousands decade counters, while the higher order counter may be the ten thousands decade counter. The map control circuit is then coupled to the ten thousands decade counter and generates control signals which are a function of the contents of this counter.

For example, the map control circuit generates control signals which cause the units counter to count the applied event signals during the first thirty thousand counts. The tens counter is enabled to count the applied event signals during the next twenty thousand counts. The hundreds counter is then enabled to count applied event signals during the next thirty thousand counts. Finally, the thousands counter is enabled to count the applied event signals during the next twenty thousand counts. This counting sequence is performed for each one hundred thousand counts that the counter circuit performs. During the counting operation, the remaining lower order counters are also re-assigned to count the tens, hundreds and thousands digits. This is also accomplished by means of the map control logic circuit and the count selection circuit.

Accordingly, the counter circuit of the present invention minimizes the number of count operations performed by the lowest order counters, and more evenly distributes the counting burden over all the lower order counters. This operation acts to increase the operating lifetime of the lower order counters and hence the operating lifetime of the entire counter circuit.

In addition, greater benefits may be had in an up counter application, or the like, since the contents of each of the lower order decades are equal to zero at the time that decade re-allocation occurs. Accordingly, re-allocation of data among the lower order counters is simplified, and the logic required to perform the data manipulation is minimized.

A method of counting applied event input signals in a counter having a plurality of lower order counters and at least one higher order counter is also provided under the principles of the present invention. The method comprises the following steps. The first step comprises generating control signals which are a function of the count of the higher order counter. The second step comprises applying the applied event input signals to different ones of said lower order counters in response to the control signals during different portions of a predetermined count cycle. The final step comprises decoding the contents of the lower order counters to produce an ordered count output signal indicative of the number of event input signals counted by the counter.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DESCRIPTION OF THE PREFERRED EMBODIMENT

Figure 1:
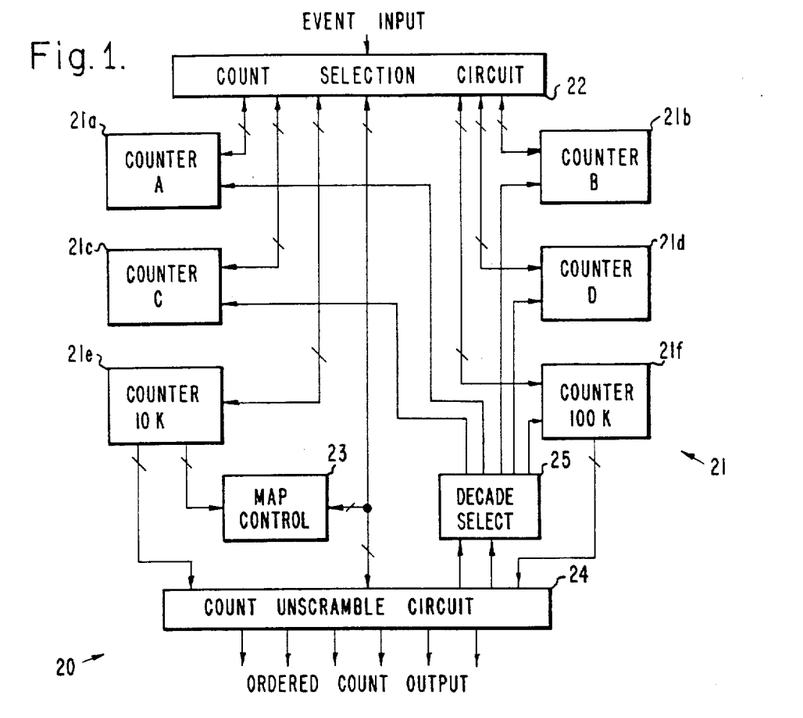
FIG. 1 illustrates an embodiment of a six decade up counter in accordance with the principles of the present invention.

Referring to FIG. 1, and not by way of limitation, an embodiment of a six decade non-volatile up counter 20 in accordance with the principles of the present invention is shown. The up counter 20 is comprised of a plurality of digital counters 21a to 21f, which, in a normal counter, count the units, tens, hundreds, thousands, ten thousands and hundred thousands digit, respectively. Each of the counters 21 may be a conventional Johnson counter, or other digital counter, or the like.

A count selection circuit 22 which comprises a logic network that is adapted to generate clock and carry signals to control the counting operation of the up counter 20 is coupled to all of the digital counters 21a to 21f. The five lowest order decade counters, comprising counters 21a to 21e are coupled to clock and carry logic circuits of the count selection circuit 22.

A map control logic circuit 23 is coupled between the ten thousands decade counter 21e, for example, and the count selection circuit 22. The map control logic circuit 23 is adapted to monitor the contents of the ten thousands decade counter 21e. The counter contents are comprised of the Johnson code, which is used to generate map select output signals. The map select output signals are coupled to the count selection circuit 22 which controls counting in the lower order decade counters 21a to 21d. This connection enables the counting functions of the lower order counters 21a to 21d to act in a predetermined manner which is a function of the contents of the ten thousands decade counter 21e.

The count selection circuit 22, in response to the map select output signals from the map control logic circuit 23, is adapted to control the application of clock and carry logic signals to the four lowest order decade counters 21a to 21d. The particular map select signal currently output by the map control logic circuit 23 determines which of the four lowest order decade counters 21a to 21d counts the units, tens, hundreds and thousands digit in the counting sequence during any particular count period.

A count unscramble circuit 24 is coupled to the decade counters 21a to 21f by way of two multiplexed data buses (BUS 1 and BUS 2), to the map control logic circuit 23 and to a decade select logic circuit 25. The count unscramble circuit 24, in response to the map select control signals, produces an ordered count output signal from the decade counters 21. Signals are coupled from the plurality of counters 21 to the count unscramble circuit 24 under microprocessor control, for example, by way of the two multiplexed data buses. Count signals from each of the counters 21 are multiplexed and transmitted over the two buses to the count unscramble circuit 24 for decoding. The decade select logic circuit 25 is adapted to route appropriate signals to each of the counters 21 in response to signals provided by the microprocessor in order to control the transmission of the count signals from the counters 21 to the count unscramble circuit 24.

Figure 2A:
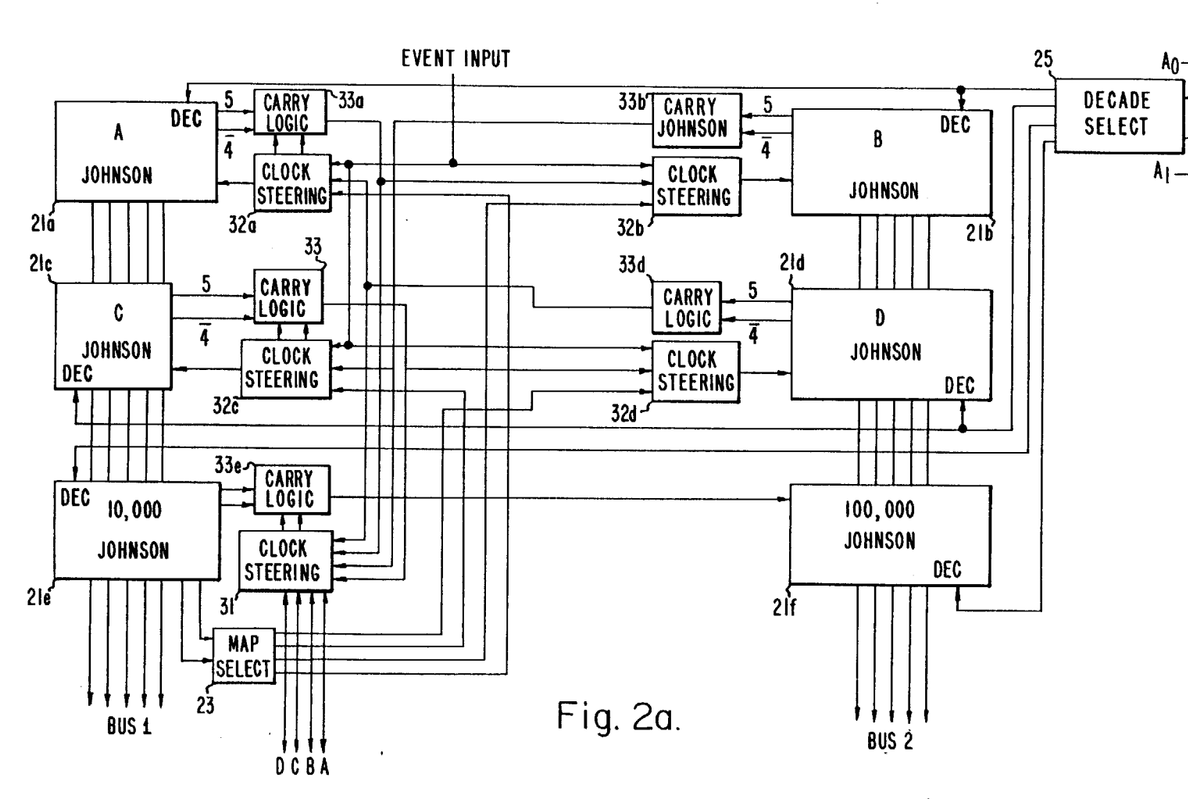
FIG. 2a shows a more detailed schematic of the major portion of the up counter of FIG. 1.

Referring to FIG. 2a, a more detailed illustration of the major portion of the up counter 20 of FIG. 1 is shown. FIG. 2a shows the count selection logic circuitry 22 in more detail. In particular, a master clock steering circuit 31 and four slave clock steering circuits 32a to 32d are shown. In addition, five carry logic circuits 33a to 33e are shown. The interconnection of these circuits will not be described in detail, but they may be connected as shown in FIG. 2a. The detailed diagrams of the various circuits shown in FIG. 2a are shown in FIGS. 3 to 7 and whose operation is discussed in detail hereinbelow. Also, the decade select logic circuit 25 is shown coupled to each of the counters 21.

FIG. 2a shows numerous control signal lines interconnecting the various components shown therein. Also shown are the Johnson codes transmitted along the control lines. These codes are also included in FIGS. 3 to 7 for the purposes of clarity. Also shown are MAP CONTROL signals A, B, C and D̂ which are coupled to the clock steering circuits 32 and routed to the count unscramble circuit 24, and described hereinbelow with reference to FIG. 2b.

Figure 2B:
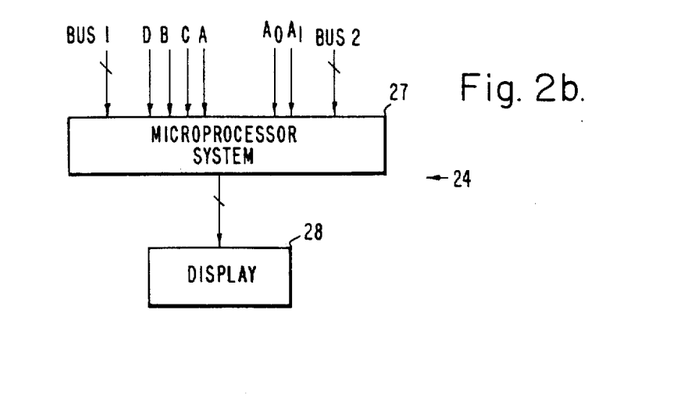
FIG. 2b illustrates a decade unscramble circuit for use in the up counter of FIG. 1.

FIG. 2b illustrates a count unscramble circuit 24 for use in the up counter 20 of FIG. 1. This circuit is comprised of a microprocessor 27 whose signal outputs are coupled to a display 28. The microprocessor 27 is coupled to the circuitry of FIG. 2a by means of the two data buses, and has inputs A, B, C and D, and provides output signals A0 and A1 as inputs to the decade select logic circuit 25.

The microprocessor 27 may be any conventional microprocessor, such as are manufactured by Intel or Motorola, or the like. The display 28 is adapted to process the count output data provided by the microprocessor 27 and display the contents of the up counter 20.

Figure 3:
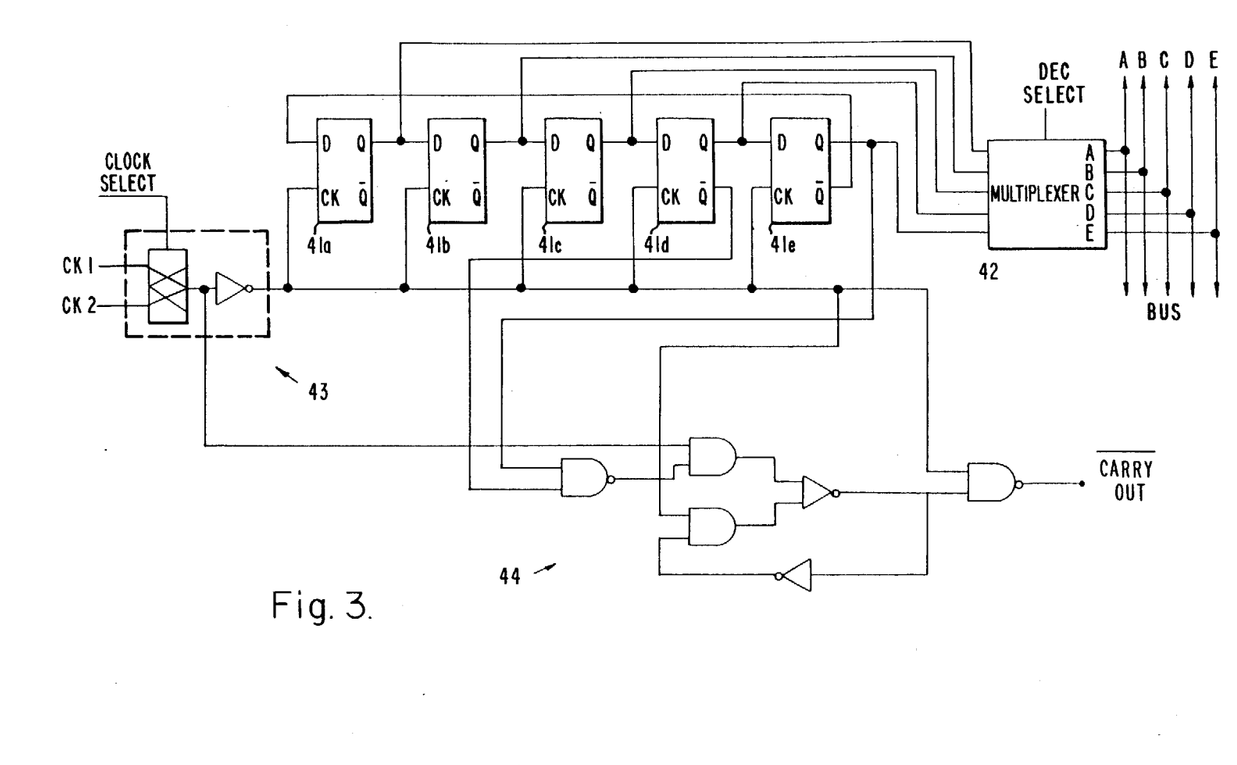
FIG. 3 illustrates a typical Johnson counter circuit for use in the up counter of FIG. 1.

Referring now to FIG. 3, a typical Johnson decade counter circuit for use in the up counter of FIG. 1 is shown. The Johnson counter comprises five flip-flops 41a to 41e whose respective Q outputs are the particular Johnson code indicative of the number of events presently counted thereby. The Johnson code is applied to the data bus by way of an output multiplexer 42. The output multiplexer 42 may be comprised of a transmission gate array. A clock circuit 43 has its output coupled to each of the clock (CK) inputs of the flip-flops 41a to 41e. A carry logic circuit 44 has inputs coupled to the clock steering circuit 43 and Q and $\overline{Q}$ outputs of particular ones of the flip-flops 41. In particular, the Q output of the fifth flip-flop and the $\overline{Q}$ output of the fourth flip-flop are coupled to the carry logic circuit 44.

The design and operation of this counter is well known in the counter art and will not be described in detail herein. However, by way of reference, a D-type flip flop which may be adapted for use in a Johnson counter as an element of a volatile version of the present invention is described in the "CMOS Databook," published by National Semiconductor Corporation, model number CD4013M/CD4013BC Dual D Flip-Flop.

Figure 4:
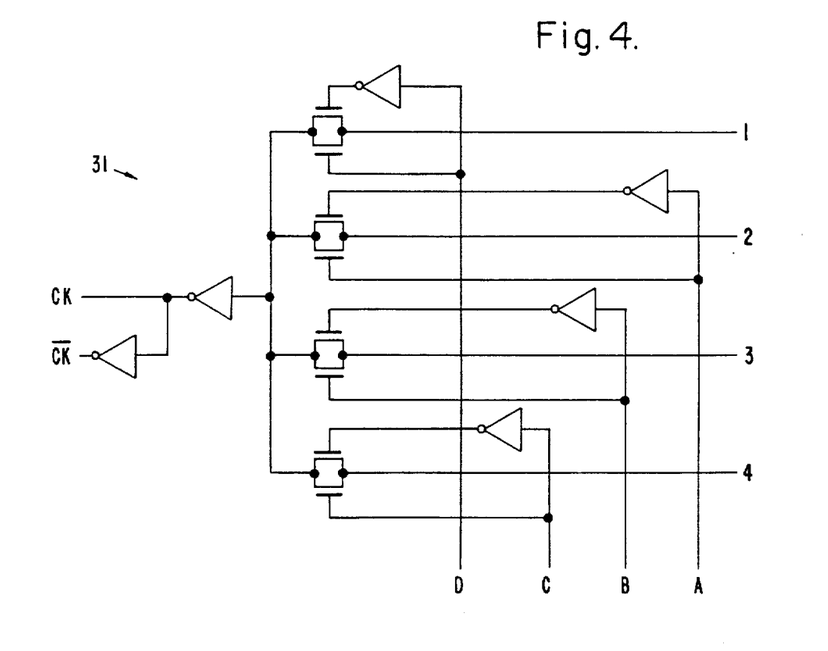
FIG. 4 illustrates a master clock steering circuit for use in the up counter of FIG. 1.

FIG. 4 illustrates the master clock steering circuit 31 for use in the up counter 20 of FIG. 1. Each of the signal input and output lines correspond specifically to those shown in FIG. 2. This circuit is comprised of a plurality of inverters and gates constructed as shown. This circuit operates such that inputs identified as A, B, C and D select inputs 1, 2, 3 or 4 as the clock input to the ten thousands decade Johnson counter 21e.

Figure 5:
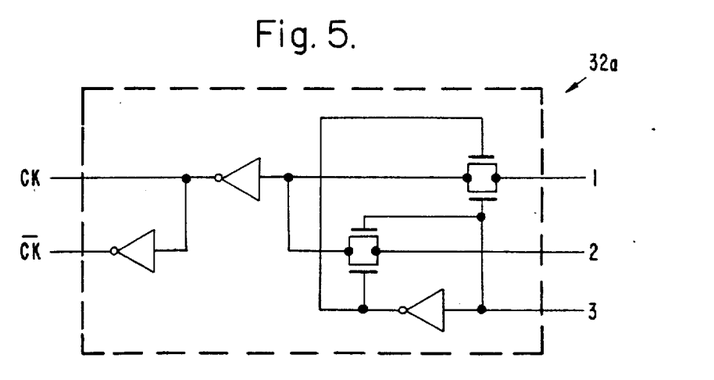
FIG. 5 illustrates a slave clock steering circuit for use in the up counter of FIG. 1.

FIG. 5 illustrates the slave clock steering circuit 32a for use in the up counter 20 of FIG. 1. The slave clock steering circuit 32a is comprised of gates and inverters constructed as shown. The design of this circuit is such that a high or low signal on input 3 selects either input 1 or 2 respectively as clock to the next counter stage.

Figure 6:
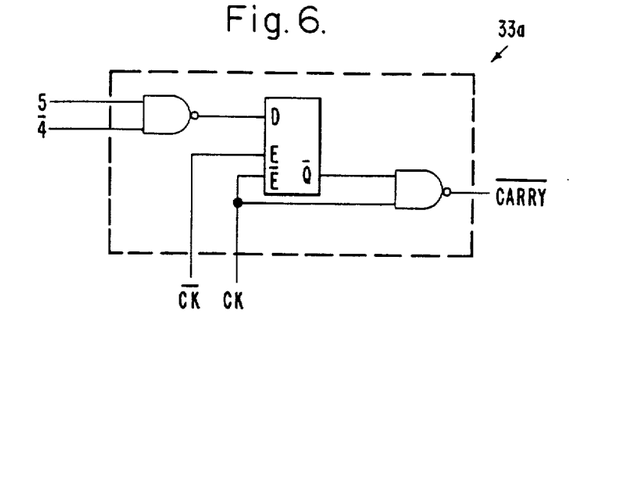
FIG. 6 illustrates a carry logic circuit for use in the up counters of FIG. 1.

FIG. 6 illustrates a typical carry logic circuit 33a (1 of 4) for use in the up counter 20 of FIG. 1. The carry logic circuit 33a is comprised of two NAND gates and a three input D-latch circuit constructed as shown. This circuit is adapted to decode and latch a "9" Johnson code and then enable the tenth pulse through as a carry pulse to the next stage. The D-latch circuit enables the tenth pulse through when the "E" input is high. The $\overline{4}$ and 5 input signal represents the Johnson code 4 and 5 derived from the Johnson counter coupled thereto. In particular, the 4 and 5 outputs from the Johnson counter are the $\overline{Q}$ and Q outputs, respectively, from the fourth and fifth flip-flops shown, for example, in the Johnson counter 21a of FIG. 3.

Figure 7:
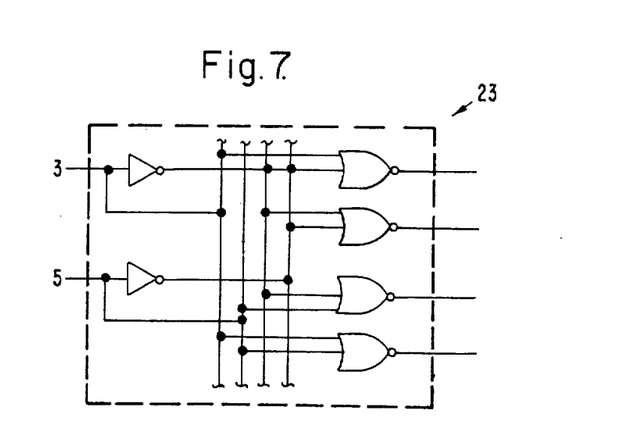
FIG. 7 illustrates a map control logic circuit for use in the up counter of FIG. 1.

FIG. 7 illustrates the map control logic circuit 23 for use in the up counter of FIG. 1. This circuit is comprised of two inverters and four NAND gates contructed as shown. This circuit is adapted to decode the output from the ten thousands counter 21e to provide inputs (A, B, C, D) to the master clock steering circuit 31 and to the slave clock steering circuits 32a to 32d, respectively.

Figure 8:
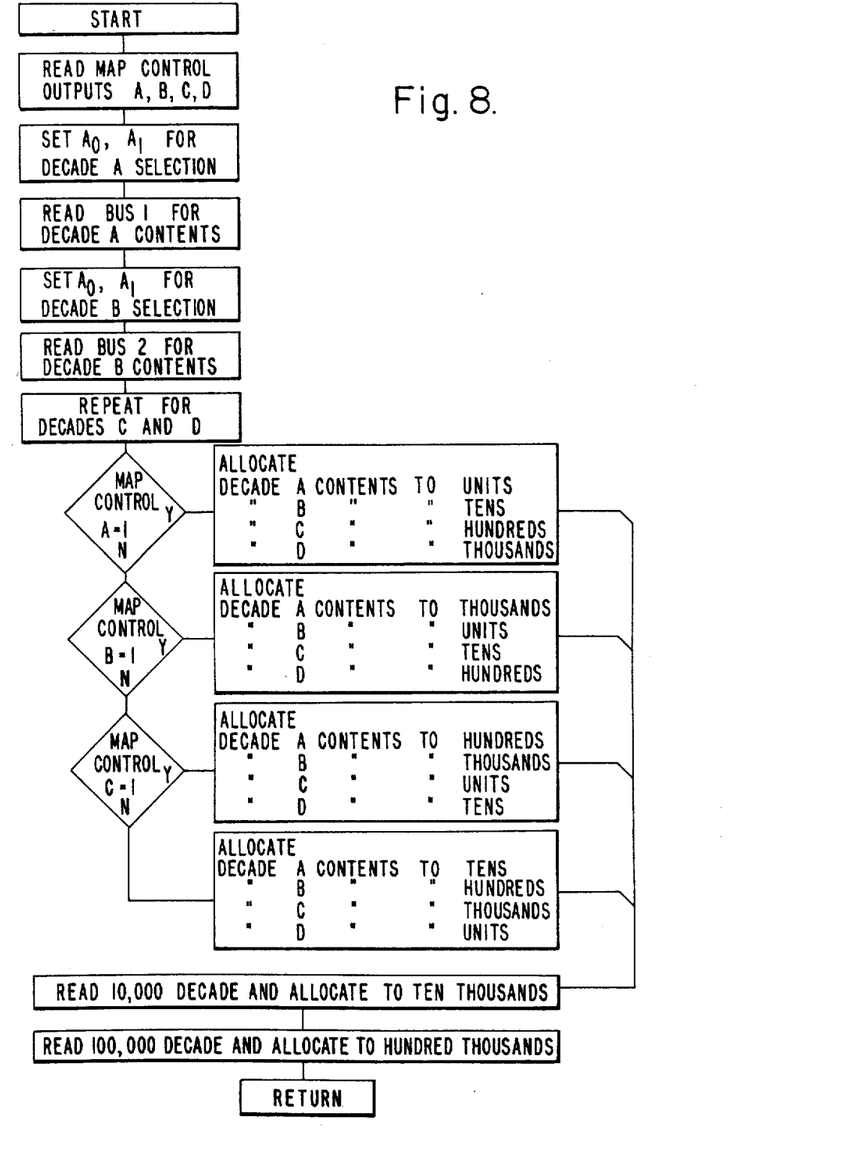
FIG. 8 illustrates a flow diagram for the unscrambling operation required for the counter of FIG. 1.

FIG. 8 illustrates a flow diagram for the design of the decade unscramble circuit 24 of FIG. 2b. Although one circuit configuration comprising the microprocessor 27 has been described, there are many ways to accomplish the unscrambling operation. The flow diagram of FIG. 8 is intended to illustrate the operations required to unscramble the count signals, and those skilled in the art may utilize this diagram to devise other schemes and circuits to accomplish the desired result.

Referring again to FIGS. 2a and 2b, the operation of the up counter 20 of the present invention will be discussed. It is to be understood that the Johnson decade counters 21 operate as conventional Johnson counters, and that the clock and carry signals are manipulated in order to accomplish the objectives of the present invention.

Event input signals are applied to the count selection circuit 22 of the counter circuit 20. The map control logic circuit enables the lower order counters 21a to 21d as follows. When the count in ten thousands decade counter 21e is a "0," "1" or "2" the first counter 21a operates as the units counter, the second counter 21b operates as the tens counter, the third counter 21c operates as the hundreds counter and the fourth counter 21d operates as the thousands counter. When the count in ten thousands decade counter 21e is a "3" or "4," the first counter 21a operates as the thousands counter, the second counter 21b operates as the units counter, the third counter 21c operates as the tens counter and the fourth counter 21d operates as the hundreds counter.

When the count in ten thousands decade counter 21e is a "5," "6" or "7," the first counter 21a operates as the hundreds counter, the second counter 21b operates as the thousands counter, the third counter 21c operates as the units counter and the fourth counter 21d operates as the tens counter. When the count in ten thousands decade counter 21e is a "8" or "9," the first counter 21a operates as the tens counter, the second counter 21b operates as the hundreds counter, the third counter 21c operates as the thousands counter and the fourth counter 21d operates as the units counter.

During each of these counting periods, the clock and carry signals are enabled and disabled, and routed according to the logic contained in the map control logic circuit 23 and the count selection circuit 22. The count unscramble circuit 24 processes the counter outputs to generate an ordered count signal indicative of the number of event input signals counted by the counter circuit 20.

Concurrently with the above counting operations, the MAP CONTROL signals A, B, C and D are applied to the microporcessor 27 in the count unscramble circuit 24. In response to these signals the microprocessor 27 outputs decade select signals A0 and A1, which may comprise the number sequence 00, 01, 10 and 11, in that sequence, for example. Upon the application of a 00 signal to the decade select logic circuit 25, for example, the Johnson codes in counters 21a and 21b are transmitted along the data buses. When a 01 is applied to the decade select logic circuit 25, the contents of the counters 21c and 21d are transmitted along the buses. Similarly, with the application of a 10 signal, the ten thousands counter 21e transmits its code along BUS 1, and with a 11 signal applied to the decade select circuit 25, the one hundred thousands counter 21f transmits its code along BUS 2.

The signals transmitted along the data buses are stored in the microprocessor 27 according to the flow diagram shown in FIG. 8 and are applied in an ordered fashion to the display 28. The decoded signals and the ten and hundred thousands count signals are thus provided as ordered count output signals from the count unscramble circuit 24, which are available for application to conventional digital display circuitry, such as an LCD display, or the like.

Permuting the counting operation of the lower order counters 21a to 21d acts to equalize the wear-out burden of these counters. In particular, in the scheme presented hereinabove, each of the lower order decade counters 21a to 21d counts a maximum of 30,000 clocks as units, 2,000 counts as tens, 300 clocks as hundreds and 20 clocks as thousands, for a maximum of 32,320 clocks per 100,000 event input signals. In addition, using Johnson counters as described above further reduces the number of stressful non-volatile WRITE actions experienced by any one bit by a factor of 5. Hence 32,320 clocks actually represents a maximum of 6,464 stresses per bit for every 100,000 event input signals. Accordingly, this circuit, and other circuits employing the concepts of the present invention will allow the counters to operate for a greater number of clock cycles, or WRITE cycles, than circuits not employing the principles of the present invention.

In addition to the above-described counter circuit embodiment, the present invention also contemplates a counting method for use with non-volatile counter. The present method involves counting applied event input signals in a counter having a plurality of lower order counters and at least one higher order counter. The method comprises the following steps. The first step comprises generating control signals which are a function of the count of the higher order counter. The second step comprises applying the applied event input signals to different ones of said lower order counters in response to the control signals during different portions of a predetermined count cycle. The final step comprises decoding the contents of the lower order counters to produce an ordered count output signal indicative of the number of event input signals counted by the counter.

Thus, there has been described a new and improved counter circuit which has improved endurance characteristics. In addition, a counting method has been disclosed for use with non-volatile counters. It is to be understood that the above-described embodiment is merely illustrative of one of the many specific embodiments which represent applications of the principles of the present invention. Clearly, numerous and varied other arrangements may be readily devised by those skilled in the art without departing from the spirit and scope of the invention.

For example, the present invention is not limited to a six decade counter, and a fewer or greater number of counters may be employed. Also, the present invention is not limited to decade counters, and its principles may be employed with counters for use in any base number system.

What is claimed is:

1. In a counter circuit that comprises a plurality of lower order counters and at least one higher order counter and which counts applied event input signals, the improvement to said counter circuit comprising:
   count selection means coupled to said counters for controling the counting of said counters in response to said event input signals;
   map control means coupled between said higher order counter and said count selection means for controlling said count selection means in response to signals derived from said higher order counter, said map control means sequentially enabling a predetermined one of said lower order counters to count individual ones of said applied event input signals; and
   count unscrambling means coupled to said plurality of lower order counters and said map control means for responding to output signals derived therefrom and for producing an ordered count output signal which is indicative of the number of event input signals counted by said counter circuit.

2. The counter circuit of claim 1 wherein said count selection means comprises:
   a plurality of clock steering and clock carry logic circuits individually coupled to said plurality of counters for providing clock and carry signals to said plurality of counters in response to said applied event input signals and map control signals provided by said map control means.

3. The counter circuit of claim 2 wherein said map control means comprises:
   a logic circuit coupled between said higher order counter and said plurality of clock steering and carry logic circuits which sequentially enables a predetermined one of said lower order counters to count individual ones of said applied event input signals.

4. The counter circuit of claim 3 wherein said count unscrambling means comprises:
   microprocessor means for producing said ordered count output signal in accordance with a predetermined computational scheme.

5. A counter circuit for counting applied event input signals, said counter circuit comprising:
   a plurality of lower order counters and at least one higher order counter;
   count selection means coupled to said counters for controlling the counting of said counters in response to said event input signals;
   map control means coupled between said higher order counter and said count selection means for controling said count selection means in response to signals derived from said higher order counter, said map control means sequentially enabling a predetermined one of said lower order counters to count individual ones of said applied event input signals; and
   count unscrambling means coupled to said plurality of lower order counters and said map control means for responding to output signals derived therefrom and for producing an ordered count output signal which is indicative of the number of event input signals counted by said counter circuit.

6. The counter circuit of claim 5 wherein said count selection means comprises:
   a plurality of clock steering and clock carry logic circuits individually coupled to said plurality of counters for providing clock and carry signals to said plurality of counters in response to said applied event input signals and map control signals provided by said map control means.

7. The counter circuit of claim 6 wherein said map control means comprises:
   a logic circuit coupled between said higher order counter and said plurality of clock steering and carry logic circuits which sequentially enables a predetermined one of said lower order counters to count individual ones of said applied event input signals.

8. The counter circuit of claim 7 wherein said count unscrambling means comprises:
   microprocessor means for producing said ordered count output signal in accordance with a predetermined computational scheme.

9. A method of counting applied event input signals in a counter having a plurality of lower order counters and at least one higher order counter, said method comprising the steps of:
   generating control signals which are a function of the count of said higher order counter;
   applying said applied event input signals to different ones of said lower order counters in response to said control signals during different portions of a predetermined count cycle; and
   decoding the contents of said lower order counters to produce an ordered count output signal indicative of the number of event input signals counted by said counter.

* * * * *